(12) United States Patent
Lin et al.

(10) Patent No.: US 10,630,250 B2
(45) Date of Patent: Apr. 21, 2020

(54) POWER AMPLIFIER DEVICE

(71) Applicant: NATIONAL CHI NAN UNIVERSITY, Nantou (TW)

(72) Inventors: Yo-Sheng Lin, Nantou (TW); Kai-Siang Lan, Nantou (TW)

(73) Assignee: NATIONAL CHI NAN UNIVERSITY, Nantou (TW)

(*) Notice: Subject to any disclaimer, the term of this patent is extended or adjusted under 35 U.S.C. 154(b) by 0 days.

(21) Appl. No.: 16/158,231

(22) Filed: Oct. 11, 2018

(65) Prior Publication Data
US 2019/0393847 A1 Dec. 26, 2019

(30) Foreign Application Priority Data
Jun. 25, 2018 (TW) ............................. 107121664 A

(51) Int. Cl.
*H03F 1/07* (2006.01)
*H03F 3/24* (2006.01)
*H03F 3/19* (2006.01)
*H03F 1/02* (2006.01)

(52) U.S. Cl.
CPC ........... *H03F 3/245* (2013.01); *H03F 1/0205* (2013.01); *H03F 3/19* (2013.01); *H03F 2200/451* (2013.01); *H03F 2203/21106* (2013.01); *H03F 2203/21142* (2013.01)

(58) Field of Classification Search
CPC .................................. H03F 1/07; H03F 1/0288
USPC .............................................. 330/124 R, 295
See application file for complete search history.

(56) References Cited

U.S. PATENT DOCUMENTS

| | | | | |
|---|---|---|---|---|
| 4,064,464 A * | 12/1977 | Morse | ............... | H03G 3/3047 330/53 |
| 6,597,242 B2 * | 7/2003 | Petz | ............... | H03F 1/526 330/124 R |
| 6,646,504 B2 * | 11/2003 | Dittmer | ............... | H03F 1/02 330/124 R |
| 7,928,801 B1 * | 4/2011 | Lam | ............... | H03F 1/32 330/124 R |
| 8,346,189 B2 * | 1/2013 | Dupuy | ............... | H03F 1/0222 330/124 R |
| 2014/0077874 A1 * | 3/2014 | Ahmed | ............... | H03F 3/211 330/124 R |

* cited by examiner

*Primary Examiner* — Henry Choe
(74) *Attorney, Agent, or Firm* — Womble Bond Dickinson (US) LLP

(57) ABSTRACT

An N-way RF power amplifier device includes a power divider, multiple first power amplifier circuits, multiple second power amplifier circuits, and a power combiner. The power divider divides an RF input signal into multiple differential signal pairs each including complementary first and second division signals. The first power amplifier circuits amplify the first division signals and the second power amplifier circuits amplify the second division signals in such a way that the amplified first division signals and the amplified second division signals have the same phase. The power combiner combines the amplified first and second division signals into an RF output signal.

10 Claims, 8 Drawing Sheets

POWER AMPLIFIER DEVICE

CROSS-REFERENCE TO RELATED APPLICATION

This application claims priority of Taiwanese Invention Patent Application No. 107121664, filed on Jun. 25, 2018.

FIELD

The disclosure relates to a power amplifier device, and more particularly to an N-way power amplifier device.

BACKGROUND

Referring to FIG. 1, a conventional four-way radio frequency (RF) power amplifier device includes three identical Wilkinson power dividers 10, 11, 12, four identical power amplification circuits 13, 14, 15, 16, and three identical Wilkinson power combiners 17, 18, 19.

Further referring to FIG. 2, the Wilkinson power divider 10 includes an input line 1010 receiving an RF input signal (Pi) that has a wavelength of λ, two quarter wave lines 1020, 1030, a resistor 1060, and two output lines 1040, 1050. The quarter wave lines 1020, 1030 each have a length of λ/4, and divide the RF input signal (Pi) into two first RF division signals (Pio). The output lines 1040, 1050 are respectively coupled to the quarter wave lines 1020, 1030 to output the first RF division signals (Pio). The resistor 1060 is coupled between the quarter wave lines 1020, 1030 to enhance isolation and prevent the first RF division signals (Pio) from interfering with each other. Having identical structure as the Wilkinson power divider 10, the input lines of the Wilkinson power dividers 11, 12 are respectively coupled to the output lines 1040, 1050 of the Wilkinson power divider 10 for receiving the first RF division signals (Pio), thereby dividing the first RF division signals (Pio) into four second RF division signals (P) that have the same voltage amplitude and the same phase. Since the input line and the output lines of each of the Wilkinson power dividers 10-12 are only used as connection terminals, their lengths would be minimized in design, so the lengths of the input line and the output lines can be ignored in comparison to the quarter wave lines.

The power amplification circuits 13-16 respectively receive the second RF division signals (P), perform power amplification on the second RF division signals (P), and output RF amplification signals (As). Each of the Wilkinson power combiners 17-19 is configured to be the same as the Wilkinson power divider 10, but is used in a reverse way for power combination. The Wilkinson power combiners 17-19 cooperatively combine the RF amplification signals (As) into an RF output signal (Po).

Such a conventional RF power amplifier device uses three Wilkinson power dividers and three Wilkinson power combiners, leading to a large chip area and a longer signal transmission path. The quarter wave lines 1020, 1030 are configured jointly as a rectangle-like shape that has several right angles, which may result in unsmooth signal transmission and greater power loss during generation of the RF output signal (Po). Greater power loss may cause lower power gain between the RF output signal (Po) and the RF input signal (Pi), thereby reducing power-added efficiency (PAE) of the RF power amplifier device.

SUMMARY

Therefore, an object of the disclosure is to provide an N-way radio frequency (RF) power amplifier device that can alleviate at least one of the drawbacks of the prior art, where $N=2^R$, and R is a positive integer not smaller than two.

According to the disclosure, the N-way RF power amplifier device includes an N-way power divider, a number (N/2) of first power amplifier circuits, a number (N/2) of first power amplifier circuits, and an N-way power combiner. The N-way power divider is disposed to receive an RF input signal, and is configured to perform balance-to-unbalance conversion and power division on the RF input signal to generate a number (N/2) of differential signal pairs, each including a first division signal and a second division signal that are complementary to each other. The first division signals of the differential signal pairs have the same phase, and the second division signals of the differential signal pairs have the same phase. The first power amplifier circuits are electrically coupled to the N-way power divider for respectively receiving the first division signals therefrom, and are configured to perform power amplification respectively on the first division signals to generate a number (N/2) of first amplification signals. The second power amplifier circuits are electrically coupled to the N-way power divider for respectively receiving the second division signals therefrom, and are configured to perform power amplification respectively on the second division signals to generate a number (N/2) of second amplification signals. The first amplification signals and the second amplification signals have the same phase and the same amplitude. The N-way power combiner is electrically coupled to the first power amplifier circuits and the second power amplifier circuits for respectively receiving the first and second amplification signals therefrom, and is configured to combine the first and second amplification signals to generate an RF output signal.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
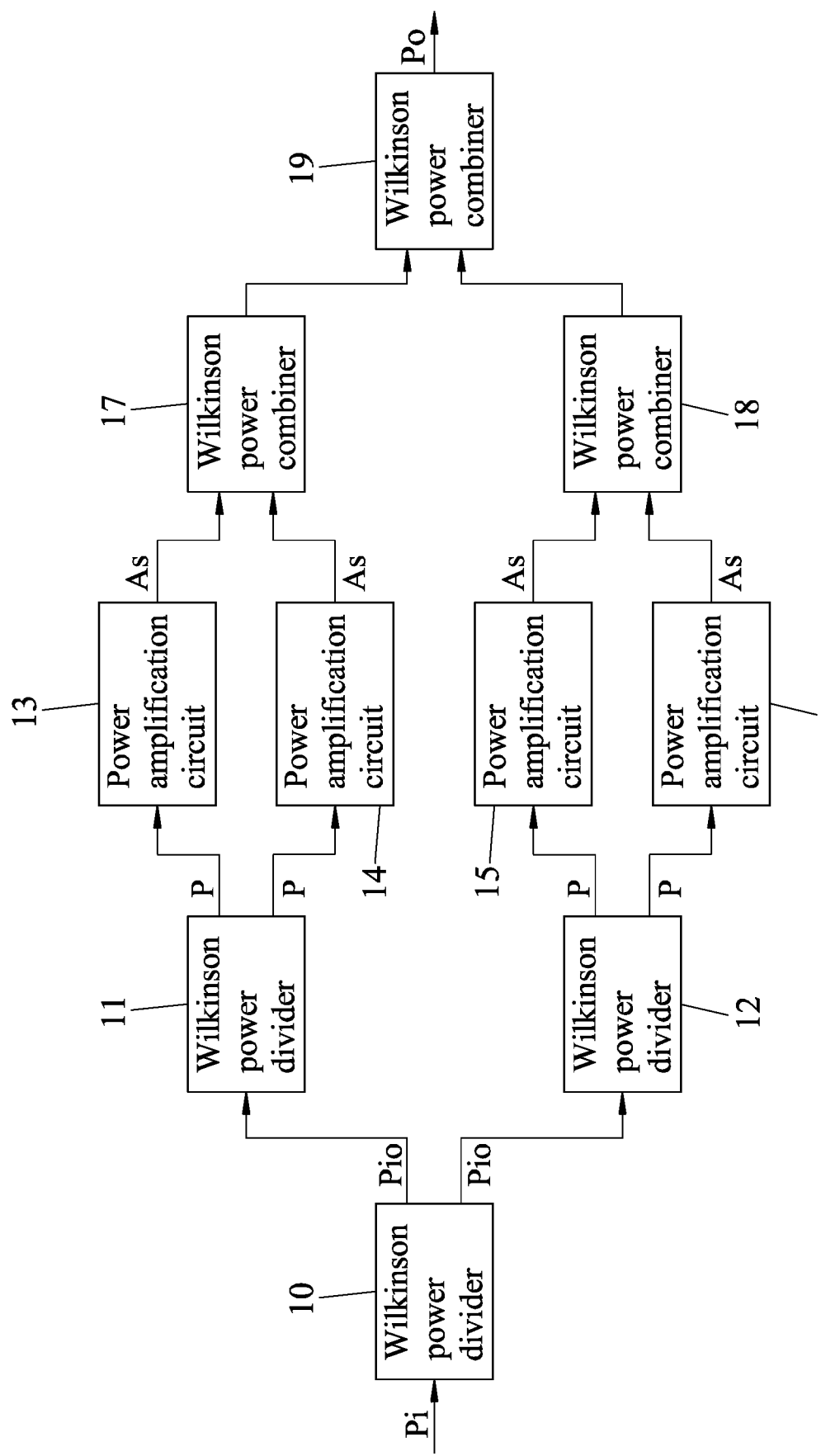
FIG. 1 is a block diagram illustrating a conventional four-way power amplifier device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
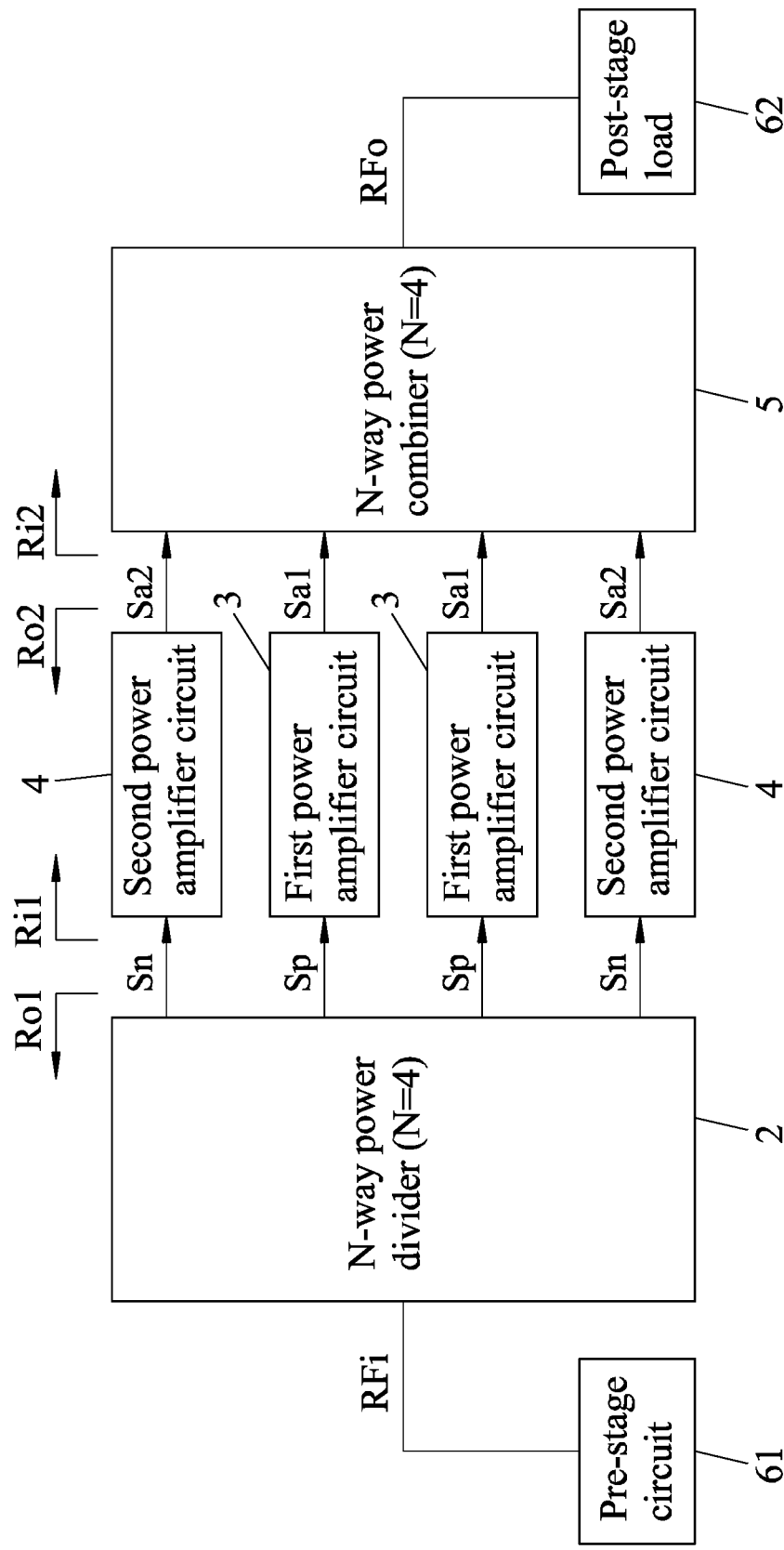
FIG. 3 is a block diagram illustrating an embodiment of the N-way power amplifier device according to this disclosure.

Referring to FIG. 3, the embodiment of the N-way power amplifier device according to this disclosure is configured to receive and amplify an RF input signal (RFi) from a pre-stage circuit 61 and to output an RF output signal (RFo) to a post-stage load 62. In practice, the N-way RF amplifier circuit may be applied in a transceiver of a communication system, in which the pre-stage circuit 61 may be, for example, a mixer or another power amplifier, and the post-stage load 62 may be, for example, an antenna.

The N-way RF power amplifier circuit includes an N-way power divider 2, a number (N/2) of first power amplifier circuits 3, a number (N/2) of second power amplifier circuits 4, and an N-way power combiner 5, where $N=2^R$ and R is a positive integer not smaller than 2. In this embodiment, it is exemplified that N=4 and R=2, but this disclosure is not limited in this respect.

The N-way power divider 2 receives the RF input signal (RFi), and is configured to perform balance-to-unbalance conversion and power division on the RF input signal (RFi) to generate a number (N/2) of differential signal pairs, each including a first division signal (Sp) and a second division signal (Sn) that are complementary to each other, where the first division signals (Sp) of the differential signal pairs have substantially the same phase, and the second division signals (Sn) of the differential signal pairs have substantially the same phase. The first division signals (Sp) and the second division signals (Sn) have substantially the same power and the same voltage amplitude, and the first division signals (Sp) have a phase difference from the second division signals (Sn) by 180 degrees.

Figure 4:
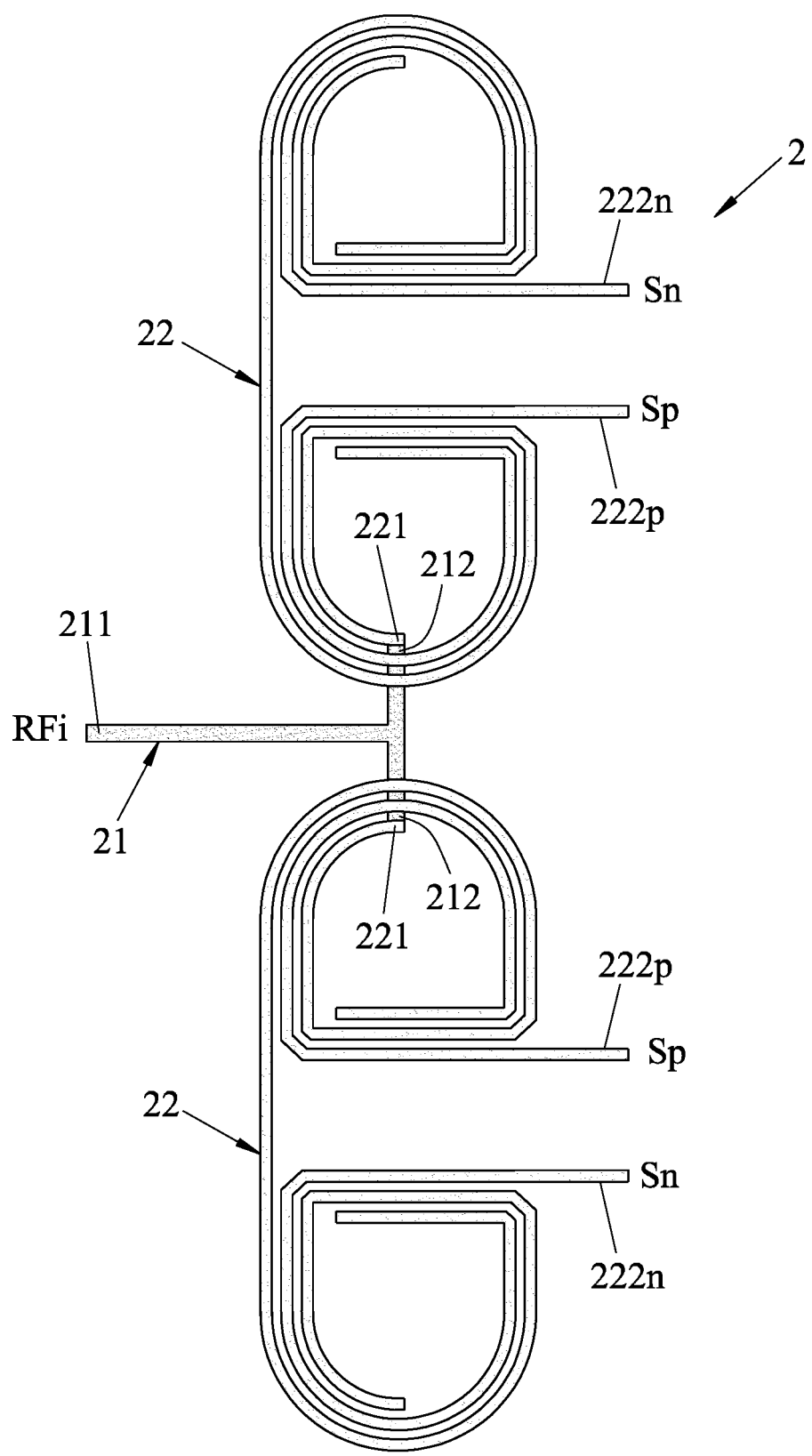
FIG. 4 is a schematic diagram illustrating a four-way power divider of this embodiment.

Further referring to FIG. 4, an exemplary implementation of a four-way power divider 2 is shown to be a dual balun that has a micro strip structure including a first micro strip portion 21 and two second micro strip portions 22 on top of the first micro strip portion 21, but this disclosure is not limited in this respect.

The first micro strip portion 21 is T-shaped and has an input end 211 disposed to receive the RF input signal (RFi), and two output ends 212. The output ends 212 have the same linear distance from the input end 211.

Each of the second micro strip portions 22 has an input end 221 and two output ends 222p, 222n, and is configured as two pairs of interwound semi-oval spirals. The input ends 221 of the second micro strip portions 22 are respectively connected to the output ends 212 of the first micro strip portion 21. Each of the second micro strip portions 22 is configured to output the first and second division signals (Sp, Sn) of a respective one of the differential signal pairs respectively at the output ends 222p, 222n thereof.

In practice, since the first micro strip portion 21 is configured merely as a connection node, a length thereof would be minimized, so that the length and an area thereof are negligible when considering the overall length and area of the four-way power divider 2. The configuration of the pairs of interwound semi-oval spirals for each of the second micro strip portions 22 makes an area occupied by the second micro strip portion 22 approximate to a conventional Wilkins on power divider, as denoted by reference numerals 11, 12 and 13 in FIG. 1. However, the four-way power divider 2 includes only two second micro strip portions 22 while the conventional four-way radio RF power amplifier device shown in FIG. 1 uses three Wilkinson power dividers 10-12, so a total area occupied by the four-way power divider 2 is about two thirds a total area occupied by the three Wilkinson power dividers 10-12 in the conventional four-way radio RF power amplifier device. In addition, a length of a signal transmission path from the input end 211 to each of the output ends 222p, 222n approximates to a length of a signal transmission path provided by each of the Wilkinson power divider 10-12. However, the conventional four-way power amplifier device shown in FIG. 1 includes two divider stages (first stage: divider 10, second stage: divider 11, 12) to divide the RF input signal (RFi) into four second division signals (P), so a length of a signal transmission path for the divider stages of the conventional four-way power amplifier device is twice that provided by the four-way power divider 2. Accordingly, the four-way power divider 2 may have less power loss during signal transmission, taking advantage of its shorter signal transmission path. Furthermore, by virtue of the configuration of the interwound semi-oval spirals for the second micro strip portions 22, the micro strip structure of the four-way power divider 2 has less right angles than the Wilkinson power divider shown in FIG. 2, thereby further reducing the power loss during signal transmission.

The first power amplifier circuits 3 are respectively and electrically coupled to the output ends 222p of the second micro strip portions 22 of the N-way power divider 2 for respectively receiving the first division signals (Sp) therefrom, and are configured to perform power amplification respectively on the first division signals (Sp) to generate a number (N/2) of first amplification signals (Sa1).

The second power amplifier circuits 4 are respectively and electrically coupled to the output ends 222n of the second micro strip portions 22 of the N-way power divider 2 for respectively receiving the second division signals (Sn) therefrom, and are configured to perform power amplification respectively on the second division signals (Sn) to generate a number (N/2) of second amplification signals (Sa2) that have the same phase and the same voltage amplitude as the first amplification signals (Sa1).

It is noted that the first division signals (Sp) and the second division signals (Sn) have the phase difference of 180 degrees, but the first and second power amplifier circuits 3, 4 are configured such that a phase change between the first amplification signals (Sa1) and the first division signals (Sp) differs from a phase change between the second amplification signals (Sa2) and the second division signals (Sn) by 180 degrees, thereby causing the first amplification signals (Sa1) and the second amplification signals (Sa2) to have the same phase and the same voltage amplitude.

Figure 5:
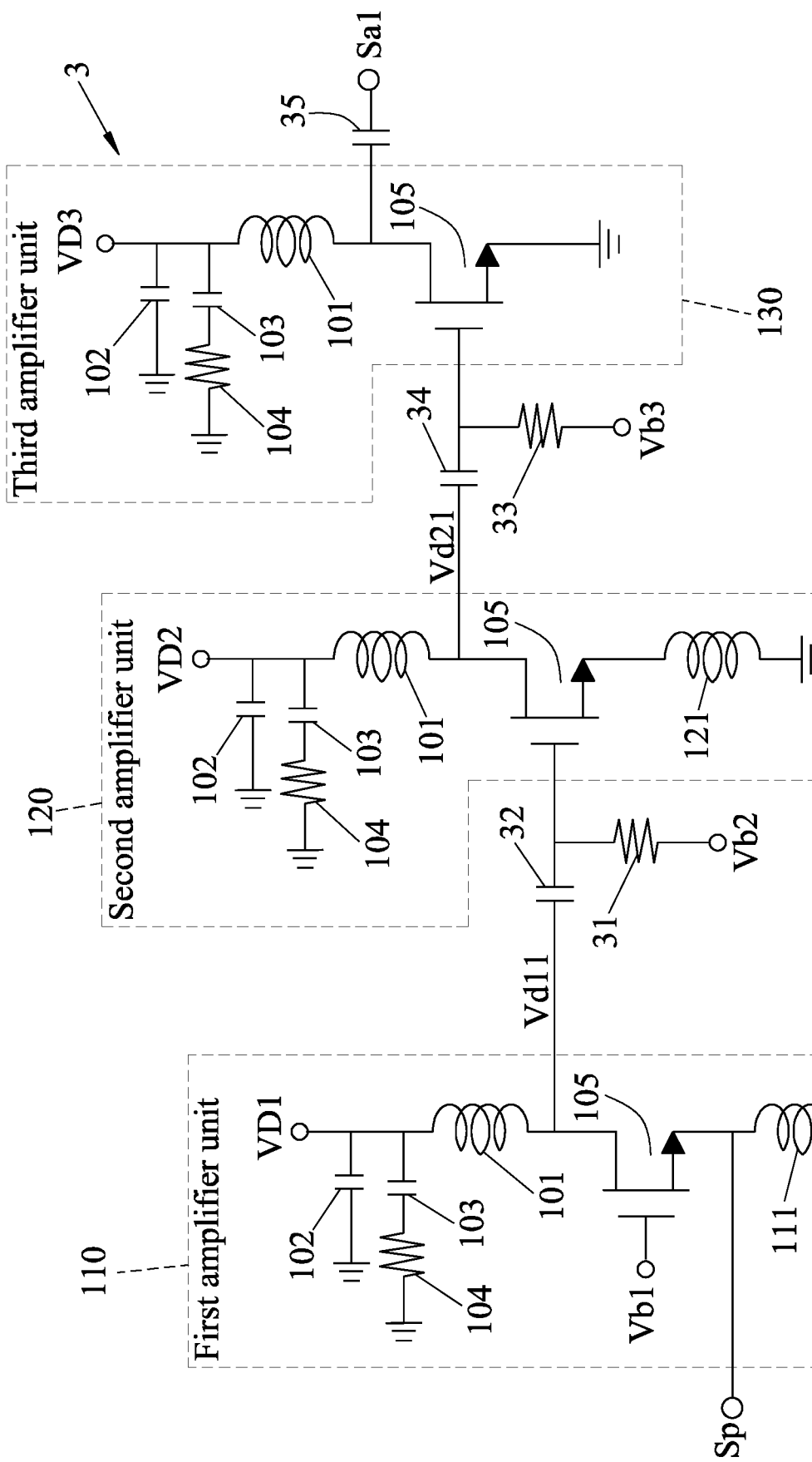
FIG. 5 is a schematic circuit diagram illustrating a first power amplifier circuit of this embodiment.
Figure 6:
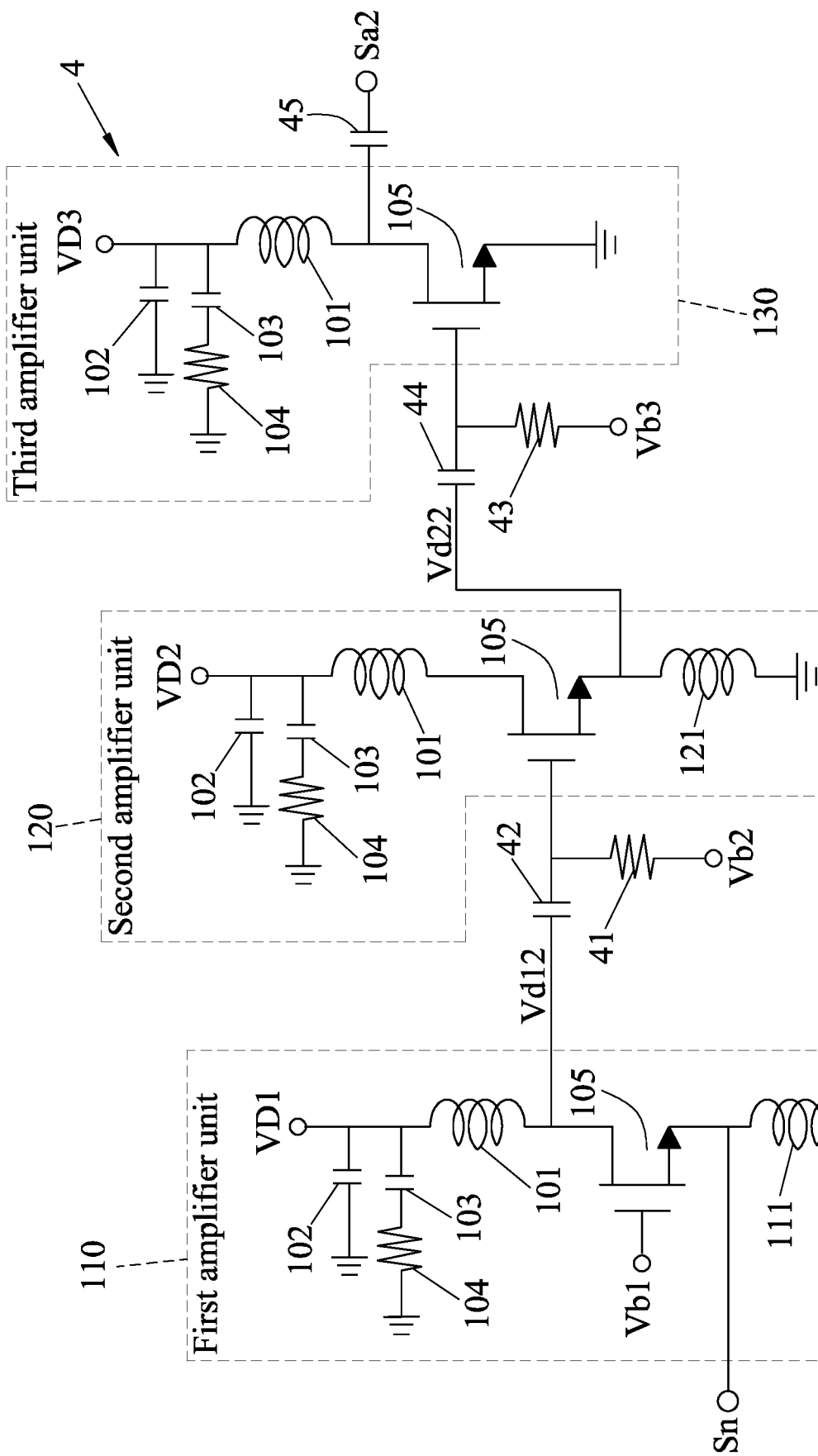
FIG. 6 is a schematic circuit diagram illustrating a second power amplifier circuit of this embodiment.

Referring to FIGS. 5 and 6, in this embodiment, each of the first power amplifier circuits 3 and the second power amplifier circuits 4 includes a first amplifier unit 110, a second amplifier unit 120 and a third amplifier unit 130 that are connected in cascade, but this disclosure is not limited in this respect.

For each first (or second) power amplifier circuit 3 (4), the first amplifier unit 110 is coupled to the N-way power divider 2 for receiving the respective one of the first (second) division signals (Sp (Sn)) therefrom, and is configured to perform power amplification on the first (second) division signal (Sp (Sn)) received thereby to generate a first-stage amplified first (second) division signal (Vd11 (Vd12)); the second amplifier unit 120 is coupled to the first amplifier unit 110 for receiving the first-stage amplified first (second) division signal (Vd11 (Vd12)) therefrom, and is configured to perform power amplification on the first-stage amplified first (second) division signal (Vd11 (Vd12)) to generate a second-stage amplified first (second) division signal (Vd21 (Vd22)); and the third amplifier unit 130 is coupled to the second amplifier unit 120 for receiving the second-stage amplified first (second) division signal (Vd21 (Vd22)) therefrom, and is configured to perform power amplification on the second-stage amplified first (second) division signal (Vd21 (Vd22)) to generate a respective one of the first (second) amplification signals (Sa1 (Sa2)).

In this embodiment, the first to third amplifier units 110, 120, 130 have a common amplifier structure including an inductor 101, two capacitors 102, 103, a resistor 104 and a transistor 105. It is noted that the first to third amplifier units 110, 120, 130 may have the same or different component parameters for the abovementioned components 101-105 as required by circuit designers, and this disclosure is not limited in this respect.

The inductor 101 has a first terminal disposed to receive a power source voltage (VD1, VD2, VD3) and a second terminal. It is noted that the power source voltages (VD1, VD2, VD3) may have the same or different magnitudes as required by the circuit designers. The capacitor 102 is coupled between the first terminal of the inductor 101 and ground for filtering out low-frequency noises in the power source voltages (VD1, VD2, VD3), such as 60 Hz noises from the mains electricity). The capacitor 103 and the resistor 104 are coupled in series between the first terminal and ground for cooperating with the capacitor 102 to enhance filtering of the low-frequency noises in the power source voltages (VD1, VD2, VD3). The transistor 105 has a first terminal coupled to the second terminal of the inductor 101, a second terminal, and a control terminal disposed to receive a bias voltage.

The first amplifier unit 110 further includes an inductor 111 coupled between the second terminal of the transistor 105 and ground, and the control terminal of the transistor 105 is disposed to receive a bias voltage (Vb1). For the first amplifier unit 110 of each first (second) power amplifier circuit 3 (4), the second terminal of the transistor 105 is coupled to a corresponding one of the output ends 222p (222n) of a corresponding one of the second micro strip portions 22 of the N-way power divider 2 for receiving the respective one of the first (second) division signals (Sp (Sn)), and the first-stage amplified first (second) division signal (Vd11 (Vd12)) is provided at the first terminal of the transistor 105.

The second amplifier unit 120 further includes an inductor 121 coupled between the second terminal of the transistor 105 and ground, and the control terminal of the transistor 105 is disposed to receive a bias voltage (Vb2) via a resistor 31, 41. For the second amplifier unit 120 of each first power amplifier circuit 3, the control terminal of the transistor 105 is coupled to the first terminal of the transistor 105 of the first amplifier unit 110 via a capacitor 32 for further receiving the first-stage amplified first division signal (Vd11), and the second-stage amplified first division signal (Vd21) is provided at the first terminal of the transistor 105 thereof. For the second amplifier unit 120 of each second power amplifier circuit 4, the control terminal of the transistor 105 is coupled to the first terminal of the transistor 105 of the first amplifier unit 110 via a capacitor 42 for further receiving the first-stage amplified second division signal (Vd12), and the second-stage amplified second division signal (Vd22) is provided at the second terminal of the transistor 105. It is noted that, since the second-stage amplified first division signal (Vd21) is provided at the first terminal of the transistor 105 of the second amplifier unit 120 of the first power amplifier circuit 3, and the second-stage amplified second division signal (Vd22) is provided at the second terminal of the transistor 105 of the second amplifier unit 120 of the second power amplifier circuit 4, the second-stage amplified first division signal (Vd21) and the second-stage amplified second division signal (Vd22) have a phase difference of 180 degrees.

For the third amplifier unit 130, the second terminal of the transistor 105 is grounded, and the control terminal of the transistor 105 is disposed to receive a bias voltage (Vb3) via a resistor 33 (43). For the third amplifier unit 130 of each first (second) power amplifier circuit 3 (4), the control terminal of the transistor 105 is coupled to the first (second) terminal of the transistor 105 of the second amplifier unit 120 via a capacitor 34 (44) for further receiving the second-stage amplified first (second) division signal (Vd21 (Vd22)), and the third amplifier unit 130 generates the respective one of the first (second) amplification signals (Sa1 (Sa2)) at the first terminal of the transistor 105.

For each of the first (second) power amplifier circuits 3 (4), the first (second) amplification signal (Sa1 (Sa2)) is outputted to the N-way power combiner 5 via a capacitor 35 (45) having a first terminal and a second terminal, where the first terminal is coupled to the first terminal of the transistor 105 of the third amplifier unit 130 of the first (second) power amplifier circuit 3 (4).

It is noted that, in this embodiment, each of the transistors 105 of the amplifier units 110, 120, 130 of the first and second power amplifier circuits 3, 4 is, for example, an N-type metal-oxide-semiconductor field-effect transistor (MOSFET) that has a drain terminal serving as the first terminal thereof, a source terminal serving as the second terminal thereof, and a gate terminal serving as the control terminal thereof.

The N-way power combiner 5 is electrically coupled to the second terminals of the capacitors 35 of the first power amplifier circuits 3 and the second terminals of the capacitors 45 of the second power amplifier circuits for respectively receiving the first and second amplification signals (Sa1, Sa2) therefrom, and is configured to combine the first and second amplification signals (Sa1, Sa2) to generate the RF output signal (RFo).

Figure 7:
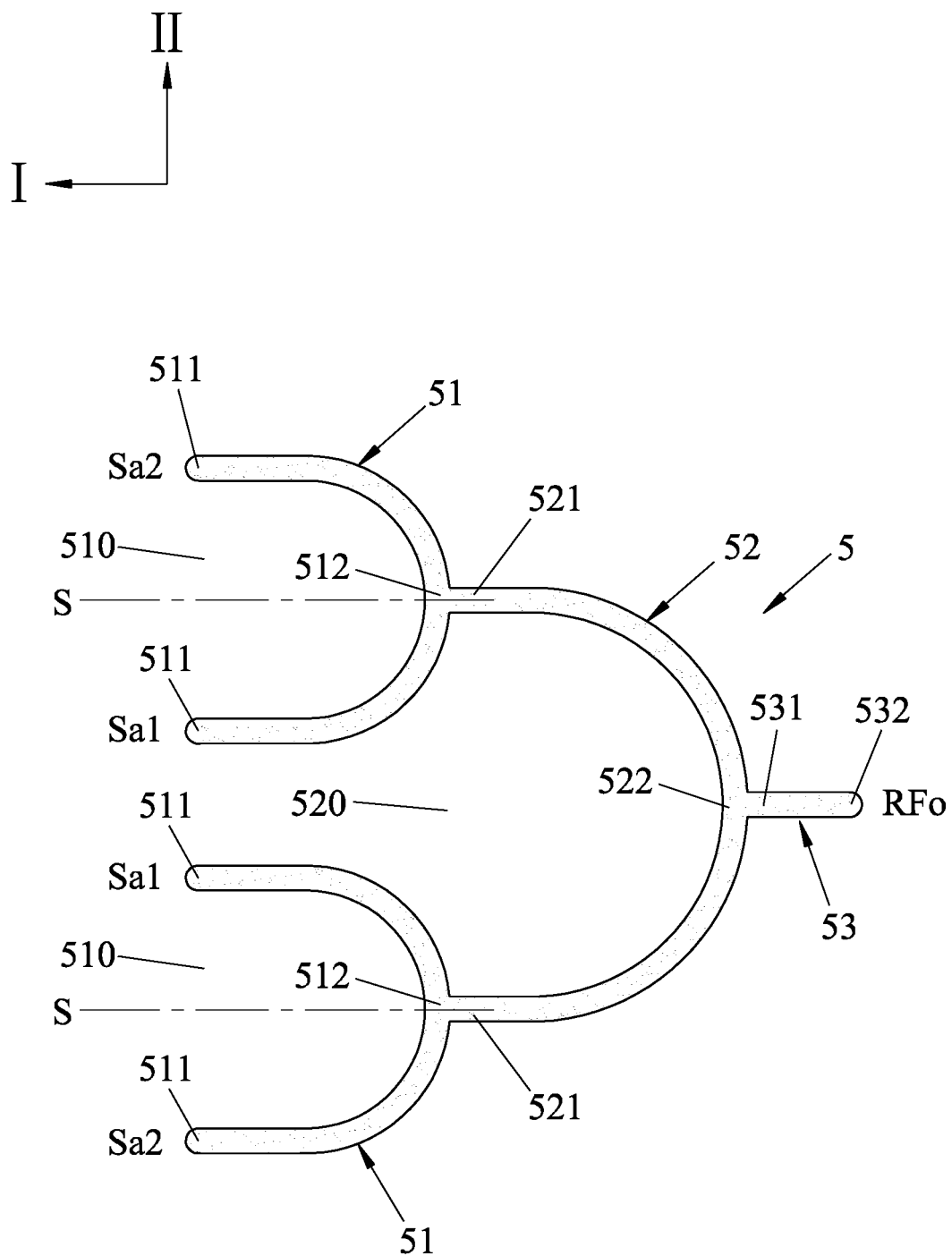
FIG. 7 is a schematic diagram illustrating a four-way power combiner of this embodiment.

Further referring to FIG. 7, an exemplary implementation of a four-way power combiner 5 is shown to be a dual, U-shaped combiner, but this disclosure is not limited in this respect.

The four-way power combiner 5, which is exemplified as the dual, U-shaped combiner, has a micro strip structure including two first-stage micro strips 51, one second-stage micro strip 52 and an output micro strip 53. Each of the first-stage micro strips 51 is U-shaped and defines a first opening 510 toward a first direction (I), and has two input ends 511 adjacent to the first opening 510, and an output node 512. In this embodiment, the first-stage micro strips 51 are parallel to each other, meaning that a symmetry line (S) of one of the first-stage micro strips 51 is parallel to a symmetry line (S) of the other one of the first-stage micro strips 51, where the symmetry line (S) of each of the first-stage micro strips 51 is defined as an imaginary line that passes through a center of the U-shaped first-stage micro strip 51 and extends in the first direction (I) to equally divide the U-shaped first-stage micro strip 51. Furthermore, the first-stage micro strips 51 are arranged side by side in a second direction (II) that is perpendicular to the first direction (I). Each of the input ends 511 of each of the first-stage micro strips 51 is coupled to the second terminal of the capacitor 35, 45 of one of the first and second power amplifier circuits 3, 4 for receiving a respective one of the first and second amplification signals (Sa1, Sa2). For each first-stage micro strip 51, the input ends 511 have the same linear distance from the output node 512, which is the center of the U-shaped first-stage micro strip 51 in this embodiment. The second-stage micro strip 52 is U-shaped and defines a second opening 520 toward the first direction (I), and has two input ends 521 and an output node 522. The input ends 521 are adjacent to the second opening 520 and are respectively connected to the output nodes 512 of the first-stage micro strips 51. The input ends 521 have the same linear distance from the output node 522, which is a center of the U-shaped second-stage micro strip 52 in this embodiment. The output micro strip 53 has an input end 531 connected to the output node 522 of the second-stage micro strip 52, and an output end 532 disposed to output the RF output signal (RFo).

Figure 2:
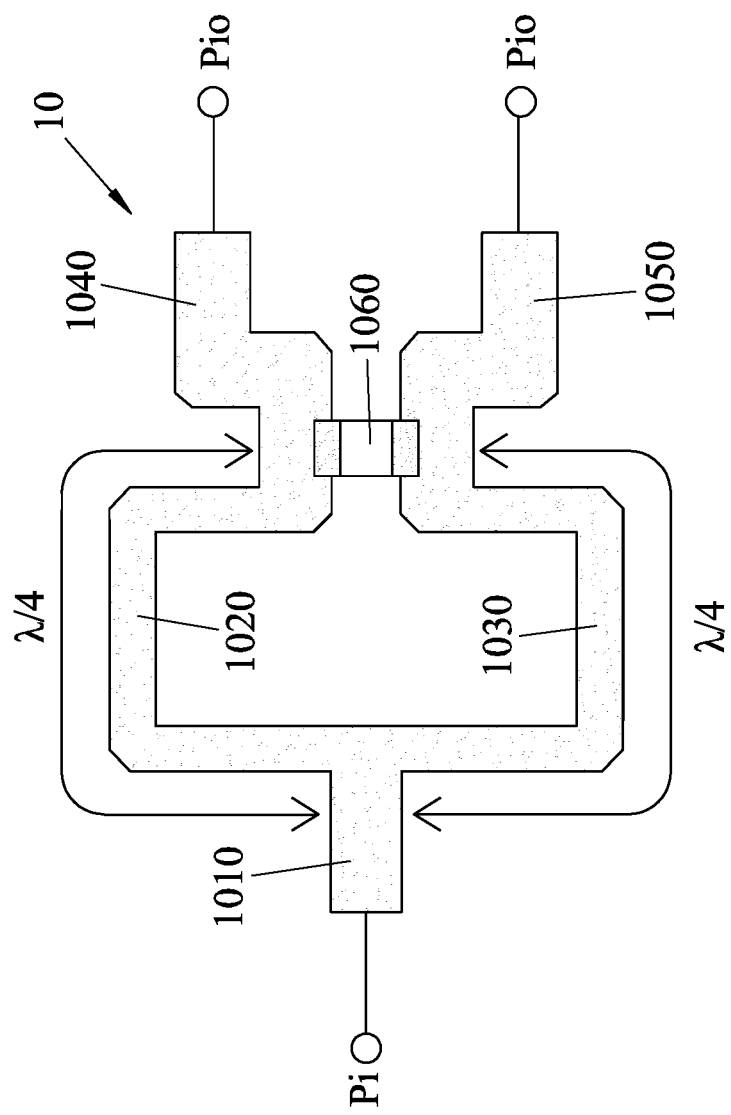
FIG. 2 is schematic diagram illustrating a conventional Wilkinson power divider.

It is noted that an output impedance seen into each of the output ends 222p, 222n of the N-way power divider 2 is configured to be 50 ohms to match an input impedance of the first amplifier unit 110 of the corresponding one of the first and second power amplifier circuits 3, 4. However, in order to achieve a maximum output power, an output impedance of each of the first and second power amplifier circuit 3, 4 may not be 50 ohms. In one exemplary implementation of this embodiment, an output impedance of each of the first and second power amplifier circuits 3, 4 is (35.4−j56.2) ohms, and an input impedance seen into each of the input ends 511 of the N-way power combiner 5 is configured to be (35.4+j56.2) ohms to match the output impedance of each of the first and second power amplifier circuits 3, 4. In practice, the input impedance of (35.4+j56.2) ohms may implemented as a resistor and an inductor that are connected in series, so that the four-way power combiner 5 may be configured as a small segment of a micro strip that serves as an inductor (e.g., the abovementioned dual, U-shaped combiner) to be connected to a resistor (not shown) included in the post-stage load 62 in one implementation. In such away, an equivalent length of a signal transmission path of the four-way power combiner 5 would be less than a quarter wavelength of the RF input signal (RFi) (e.g., 10% to 50% of the quarter wavelength of the RF input signal (RFi)), and less than a length of a signal transmission path provided by the three Wilkinson power combiners 17-19 in the conventional four-way power amplifier device, as shown in FIG. 1, and a total area occupied by the four-way power combiner 5 would be far less than a total area occupied by the Wilkinson power combiners 17-19 in the conventional four-way power amplifier device. As a result, the four-way power combiner 5 may have less power loss during signal transmission, taking advantage of its shorter signal transmission path. Furthermore, by virtue of the configuration of the U-shaped first-stage micro strips 51 and U-shaped second-stage micro strip 52, the micro strip structure of the four-way power combiner 5 have less right angles than the Wilkinson power combiners, thereby further reducing the power loss during signal transmission.

Power added efficiency (PAE) of the N-way power amplifier device of this embodiment may be obtained according to:

$$PAE = \frac{Pout - Pin}{P_{DC}} = \frac{G \cdot Pin - Pin}{P_{DC}},$$

where Pin represents an input power of the RF input signal (RFi), Pout represents an output power of the RF output signal (RFo), equaling (G×Pin), $P_{DC}$ represents a direct-current (DC) power provided by an external power supply (not shown) for enabling normal operation of the N-way power amplifier device of this embodiment, and G represents a power gain of the N-way power amplifier device of this embodiment. It can be understood from the above equation that the PAE increases with increase of the power gain (G) (i.e., increase of the output power). As mentioned hereinbefore, each of the four-way power divider 2 and the four-way power combiner 5 contributes to less power loss because of the short signal transmission paths and the configuration/shape thereof, so the four-way power amplifier device of this embodiment may have a greater power gain (G), leading to higher PAE.

Figure 8:
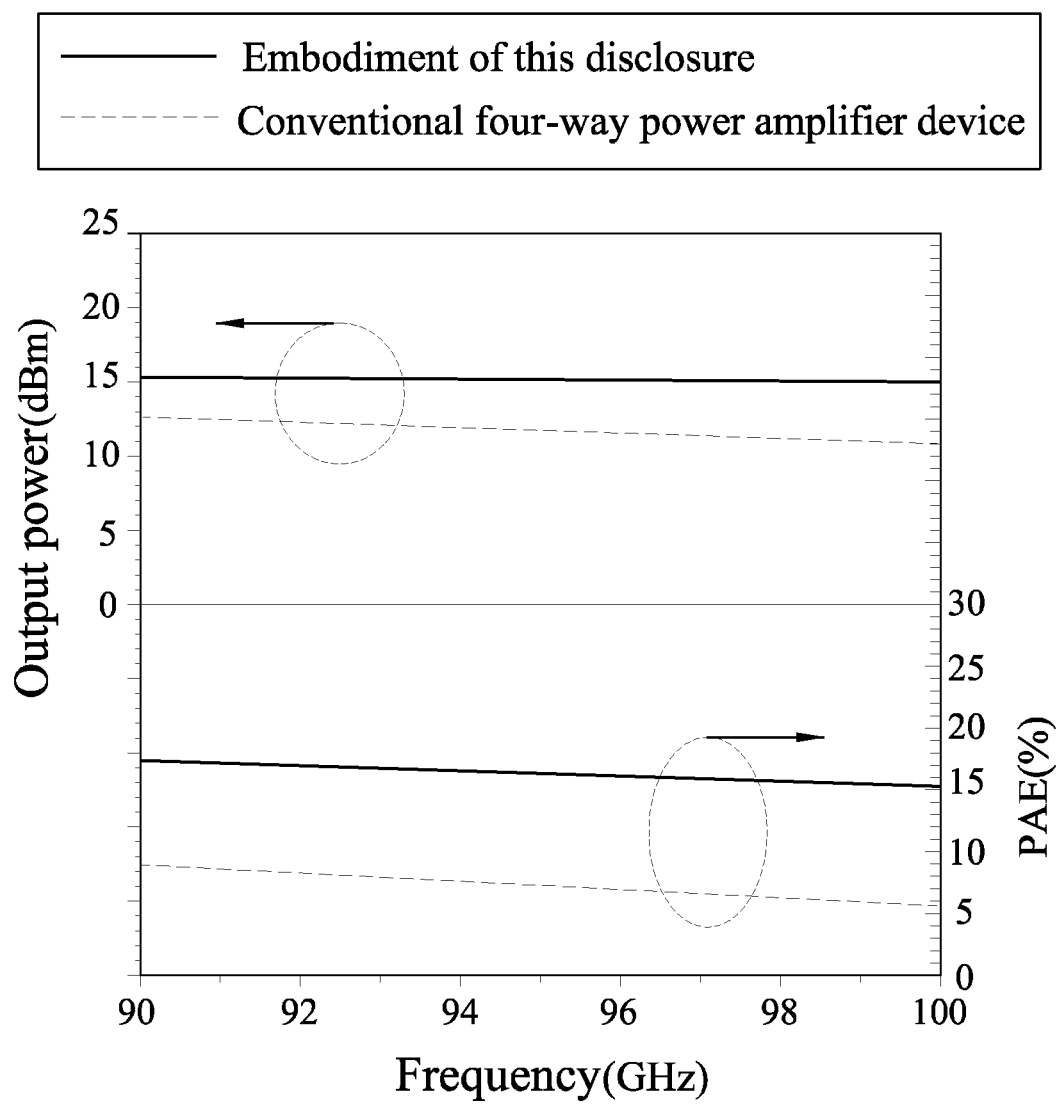
FIG. 8 is a plot illustrating a simulation result comparing output power and PAE between the conventional four-way power amplifier device and the four-way power amplifier device according to this embodiment.

FIG. 8 shows a simulation result for comparing output power and PAE between the four-way power amplifier device of this embodiment and the conventional four-way power amplifier device as shown in FIG. 1, with respect to a variety of frequencies of the RF output signal. It is known from FIG. 8 that, when the RF output signal falls within a frequency band of between 90 GHz and 100 GHz, the RF output signal (RFo) provided by the four-way power amplifier device of this embodiment has output power of about 15 dBm, and PAE of between 15% and 17%. On the other hand, the RF output signal (Po) provided by the conventional four-way power amplifier device has output power of between 11 and 12.5 dBm, and PAE of between 5.5% and 8% within the same frequency band. In other words, the four-way power amplifier device of this embodiment has better output power and PAE in comparison to the conventional four-way power amplifier device.

In summary, the four-way power divider 2 and the four-way power combiner 5 of this embodiment are configured to have particular shapes and configurations which lead to smaller chip areas, shorter signal transmission paths and less right angles in the micro strip structure, thereby resulting in less power loss during signal transmission, and thus better power gain and PAE. The first and second power amplifier circuits 3 and 4 are configured to provide different phase changes with the difference being 180 degrees, enabling the N-way power divider 2 that divides the RF input signal (RFi) into multiple differential signal pairs to be used in the N-way power amplifier device of this embodiment.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An N-way radio frequency (RF) power amplifier device, comprising:
    an N-way power divider disposed to receive an RF input signal, and configured to perform balance-to-unbalance conversion and power division on the RF input signal to generate a number (N/2) of differential signal pairs, each including a first division signal and a second division signal that are complementary to each other, the first division signals of the differential signal pairs having a same phase, the second division signals of the differential signal pairs having a same phase, where $N=2^R$, and R is a positive integer not smaller than two;
    a number (N/2) of first power amplifier circuits electrically coupled to said N-way power divider for respectively receiving the first division signals therefrom, and configured to perform power amplification respectively on the first division signals to generate a number (N/2) of first amplification signals;
    a number (N/2) of second power amplifier circuits electrically coupled to said N-way power divider for respectively receiving the second division signals therefrom, and configured to perform power amplification respectively on the second division signals to generate a number (N/2) of second amplification signals, wherein the first amplification signals and the second amplification signals have a same phase and a same amplitude; and
    an N-way power combiner electrically coupled to said first power amplifier circuits and said second power amplifier circuits for respectively receiving the first and second amplification signals therefrom, and configured to combine the first and second amplification signals to generate an RF output signals;
    wherein R=2, N=4, and said N-way power divider is a dual balun that has a micro strip structure including:
    a first micro strip portion that is T-shaped and that has an input end disposed to receive the RF input signal, and two output ends, said output ends having a same linear distance with respect to said input end; and
    two second micro strip portions each having an input end and two output ends, said input ends of said second micro strip portions being respectively connected to said output ends of said first micro strip portion, each of said second micro strip portions being configured to output a respective one of the differential signal pairs at said output ends thereof; and
    wherein each said second micro strip portions is configured as two pairs of interwound semi-oval spirals.

2. An N-way radio frequency (RF) power amplifier device, comprising:
    an N-way power divider disposed to receive an RF input signal, and configured to perform balance-to-unbalance conversion and power division on the RF input signal to generate a number (N/2) of differential signal pairs, each including a first division signal and a second division signal that are complementary to each other, the first division signals of the differential signal pairs having a same phase, the second division signals of the differential signal pairs having a same phase, where $N=2^R$, and R is a positive integer not smaller than two;
    a number (N/2) of first power amplifier circuits electrically coupled to said N-way power divider for respectively receiving the first division signals therefrom, and configured to perform power amplification respectively on the first division signals to generate a number (N/2) of first amplification signals;
    a number (N/2) of second power amplifier circuits electrically coupled to said N-way power divider for respectively receiving the second division signals therefrom, and configured to perform power amplification respectively on the second division signals to generate a number (N/2) of second amplification signals, wherein the first amplification signals and the second amplification signals have a same phase and a same amplitude; and
    an N-way power combiner electrically coupled to said first power amplifier circuits and said second power amplifier circuits for respectively receiving the first and second amplification signals therefrom, and configured to combine the first and second amplification signals to generate an RF output signal;
    wherein R=2, N=4, and said N-way power combiner has a micro strip structure including:
    two first-stage micro strips, each of which is U-shaped and defines a first opening and which are parallel to each other, wherein each of said first-stage micro strips has two input ends adjacent to said first opening, and an output node, wherein, for each of said first-stage micro strips, said input ends have a same distance from said output node, and each of said input ends of said first-stage micro strips is coupled to one of said first and second power amplifier circuits for receiving a respective one of the first and second amplification signals;
    a second-stage micro strip, which is U-shaped and which defines a second opening, said second-stage micro strip having two input ends adjacent to said second opening, and an output node, said input ends of said second-stage micro strip being respectively connected to said output nodes of said first-stage micro strips, wherein, for said second-stage micro strip, said input ends have a same linear distance from said output node; and
    an output micro strip which has an input end connected to said output node of said second-stage micro strip, and an output end disposed to output the RF output signal.

3. An N-way radio frequency (RF) power amplifier device, comprising:
    an N-way power divider disposed to receive an RF input signal, and configured to perform balance-to-unbalance conversion and power division on the RF input signal to generate a number (N/2) of differential signal pairs, each including a first division signal and a second division signal that are complementary to each other, the first division signals of the differential signal pairs having a same phase, the second division signals of the differential signal pairs having a same phase, where $N=2^R$, and R is a positive integer not smaller than two;
    a number (N/2) of first power amplifier circuits electrically coupled to said N-way power divider for respectively receiving the first division signals therefrom, and configured to perform power amplification respectively on the first division signals to generate a number (N/2) of first amplification signals;
    a number (N/2) of second power amplifier circuits electrically coupled to said N-way power divider for respectively receiving the second division signals therefrom, and configured to perform power amplification respectively on the second division signals to generate a number (N/2) of second amplification signals, wherein the first amplification signals and the second amplification signals have a same phase and a same amplitude; and
    an N-way power combiner electrically coupled to said first power amplifier circuits and said second power amplifier circuits for respectively receiving the first and second amplification signals therefrom, and configured to combine the first and second amplification signals to generate an RF output signal;

wherein each of said first power amplifier circuits includes:

a first amplifier unit coupled to said N-way power divider for receiving the respective one of the first division signals therefrom, and configured to perform power amplification on the first division signal received thereby to generate a first-stage amplified first division signal;

a second amplifier unit coupled to said first amplifier unit for receiving the first-stage amplified first division signal therefrom, and configured to perform power amplification on the first-stage amplified first division signal to generate a second-stage amplified first division signal; and a third amplifier unit coupled to said second amplifier unit for receiving the second-stage amplified first division signal therefrom, and configured to perform power amplification on the second-stage amplified first division signal to generate the respective one of the first amplification signals.

4. The N-way RF power amplifier device of claim 3, wherein at least one of said first, second, and third amplifier units has an amplifier structure that includes:

a first inductor having a first terminal and a second terminal; and a transistor having a first terminal coupled to said second terminal of said first inductor, a second terminal, and a control terminal disposed to receive a bias voltage; and wherein, when said first amplifier unit has said amplifier structure, said first amplifier unit further includes a second inductor coupled between said second terminal of said transistor and ground, said second terminal of said transistor is coupled to said N-way power divider for receiving the respective one of the first division signals, and the first-stage amplified first division signal is provided at said first terminal of said transistor;

wherein, when said second amplifier unit has said amplifier structure, said second amplifier unit further includes a second inductor coupled between said second terminal of said transistor and ground, said control terminal of said transistor is coupled to said first amplifier unit for further receiving the first-stage amplified first division signal, and the second-stage amplified first division signal is provided at said first terminal of said transistor; and wherein, when said third amplifier unit has said amplifier structure, said second terminal of said transistor is grounded, said control terminal of said transistor is coupled to said second amplifier unit for further receiving the second-stage amplified first division signal, and said third amplifier unit generates the respective one of the first amplification signals at said first terminal of said transistor.

5. The N-way RF power amplifier device of claim 3, wherein each of said second power amplifier circuits includes:

a first amplifier unit coupled to said N-way power divider for receiving the respective one of the second division signals therefrom, and configured to perform power amplification on the second division signal received thereby to generate a first-stage amplified second division signal;

a second amplifier unit coupled to said first amplifier unit of said second power amplifier circuit for receiving the first-stage amplified second division signal therefrom, and configured to perform power amplification on the first-stage amplified second division signal to generate a second-stage amplified second division signal that is different from the first-stage amplified first division signal in phase by 180 degrees; and a third amplifier unit coupled to said second amplifier unit of said second power amplifier circuit for receiving the second-stage amplified second division signal therefrom, and configured to perform power amplification on the second-stage amplified second division signal to generate the respective one of the second amplification signals.

6. The N-way RF power amplifier device of claim 5, wherein said second amplifier unit of each of said first power amplifier circuits includes:

a first inductor having a first terminal and a second terminal;

a first transistor having a first terminal coupled to said second terminal of said first inductor and providing the second-stage amplified first division signal, a second terminal, and a control terminal disposed to receive a bias voltage and coupled to said first amplifier unit for receiving the first-stage amplified first division signal; and a second inductor coupled between said second terminal of said first transistor and ground; and wherein said second amplifier unit of each of said second power amplifier circuits includes:

a third inductor having a first terminal and a second terminal;

a second transistor having a first terminal coupled to said second terminal of said third inductor, a second terminal providing the second-stage amplified second division signal, and a control terminal disposed to receive a bias voltage and coupled to said first amplifier unit of said second power amplifier circuit for receiving the first-stage amplified second division signal; and a fourth inductor coupled between said second terminal of said second transistor and ground.

7. The N-way RF power amplifier device of claim 1, wherein each of said second power amplifier circuits includes:

a first amplifier unit coupled to said N-way power divider for receiving the respective one of the second division signals therefrom, and configured to perform power amplification on the second division signal received thereby to generate a first-stage amplified second division signal;

a second amplifier unit coupled to said first amplifier unit for receiving the first-stage amplified second division signal therefrom, and configured to perform power amplification on the first-stage amplified second division signal to generate a second-stage amplified second division signal; and a third amplifier unit coupled to said second amplifier unit of said second power amplifier circuit for receiving the second-stage amplified second division signal therefrom, and configured to perform power amplification on the second-stage amplified second division signal to generate the respective one of the second amplification signals.

8. The N-way RF power amplifier device of claim 7, wherein at least one of said first, second, and third amplifier units has an amplifier structure that includes:

a first inductor having a first terminal and a second terminal; and a transistor having a first terminal coupled to said second terminal of said first inductor, a second terminal, and a control terminal disposed to receive a bias voltage;

wherein, when said first amplifier unit has said amplifier structure, said first amplifier unit further includes a second inductor coupled between said second terminal of said transistor and ground, said second terminal of said transistor is coupled to said N-way power divider for receiving the respective one of the second division signals, and the first-stage amplified second division signal is provided at said first terminal of said transistor;

wherein, when said second amplifier unit has said amplifier structure, said second amplifier unit further includes a second inductor coupled between said second terminal of said transistor and ground, said control terminal of said transistor is coupled to said first amplifier unit for further receiving the first-stage amplified second division signal, and the second-stage amplified second division signal is provided at said second terminal of said transistor; and wherein, when said third amplifier unit has said amplifier structure, said second terminal of said transistor is grounded, said control terminal of said transistor is coupled to said second amplifier unit for further receiving the second-stage amplified second division signal, and said third amplifier unit generates the respective one of the second amplification signals at said first terminal of said transistor.

9. The N-way RF power amplifier device of claim 2, wherein each of said second power amplifier circuits includes:

a first amplifier unit coupled to said N-way power divider for receiving the respective one of the second division signals therefrom, and configured to perform power amplification on the second division signal received thereby to generate a first-stage amplified second division signal;

a second amplifier unit coupled to said first amplifier unit for receiving the first-stage amplified second division signal therefrom, and configured to perform power amplification on the first-stage amplified second division signal to generate a second-stage amplified second division signal; and a third amplifier unit coupled to said second amplifier unit of said second power amplifier circuit for receiving the second-stage amplified second division signal therefrom, and configured to perform power amplification on the second-stage amplified second division signal to generate the respective one of the second amplification signals.

10. The N-way RF power amplifier device of claim 9, wherein at least one of said first, second, and third amplifier units has an amplifier structure that includes:

a first inductor having a first terminal and a second terminal; and a transistor having a first terminal coupled to said second terminal of said first inductor, a second terminal, and a control terminal disposed to receive a bias voltage;

wherein, when said first amplifier unit has said amplifier structure, said first amplifier unit further includes a second inductor coupled between said second terminal of said transistor and ground, said second terminal of said transistor is coupled to said N-way power divider for receiving the respective one of the second division signals, and the first-stage amplified second division signal is provided at said first terminal of said transistor;

wherein, when said second amplifier unit has said amplifier structure, said second amplifier unit further includes a second inductor coupled between said second terminal of said transistor and ground, said control terminal of said transistor is coupled to said first amplifier unit for further receiving the first-stage amplified second division signal, and the second-stage amplified second division signal is provided at said second terminal of said transistor; and wherein, when said third amplifier unit has said amplifier structure, said second terminal of said transistor is grounded, said control terminal of said transistor is coupled to said second amplifier unit for further receiving the second-stage amplified second division signal, and said third amplifier unit generates the respective one of the second amplification signals at said first terminal of said transistor.

* * * * *